United States Patent
Maeda et al.

(10) Patent No.: US 6,664,021 B1
(45) Date of Patent: Dec. 16, 2003

(54) PHOTOSENSITIVE POLYMIDE PRECURSOR RESIN COMPOSITION

(75) Inventors: Hirotoshi Maeda, Yokohama (JP); Kouichi Kunimune, Ichihara (JP); Eiji Watanabe, Yokohama (JP); Kouichi Katou, Yokohama (JP)

(73) Assignee: Chisso Corporation, Osaka (JP)

( * ) Notice: Subject to any disclaimer, the term of this patent is extended or adjusted under 35 U.S.C. 154(b) by 1743 days.

(21) Appl. No.: 08/756,440

(22) Filed: Nov. 26, 1996

Related U.S. Application Data

(63) Continuation of application No. 08/400,506, filed on Mar. 7, 1995, now abandoned, which is a continuation of application No. 08/199,001, filed on Feb. 18, 1994, now abandoned.

(30) Foreign Application Priority Data

Feb. 25, 1993 (JP) .............................................. 5-036408
Dec. 28, 1993 (JP) .............................................. 5-337862

(51) Int. Cl.$^7$ ................................................. G03C 1/76
(52) U.S. Cl. ................................................... 430/270.1
(58) Field of Search ...................................... 430/270.1

(56) References Cited

U.S. PATENT DOCUMENTS

| | | | |
|---|---|---|---|
| 4,656,238 A | * 4/1987 | Kunimune et al. | ............ 528/26 |
| 4,748,228 A | * 5/1988 | Shoji et al. | .................... 528/26 |
| 4,818,806 A | * 4/1989 | Kunimune et al. | ............ 528/26 |
| 4,904,563 A | * 2/1990 | Aoai et al. | ................ 430/270.1 |
| 5,302,489 A | * 4/1994 | Shu | |
| 5,342,739 A | * 8/1994 | Katou et al. | ................. 430/325 |
| 5,442,024 A | * 8/1995 | Kunimune et al. | ......... 522/172 |

FOREIGN PATENT DOCUMENTS

| JP | 4-120171 | * 4/1992 |
|---|---|---|
| JP | 9215045 | * 9/1992 |

OTHER PUBLICATIONS

Buhr, Gerhard et al, "Non–Ionic Photo acid Generating Compounds", *Proceedings of the ACS Division of Polymeric Materials: Science and Engineering*, vol. 61, pp. 269–277.*

* cited by examiner

Primary Examiner—Laura Weiner
(74) Attorney, Agent, or Firm—Leydig Voit & Mayer, Ltd.

(57) ABSTRACT

A photosensitive resin composition is provide which includes a compound for generating an acid by light irradiation and at least one polyimide precursor selected from the group consisting of a silicon-containing polyimide precursor (a) obtained from A mol of a tetracarboxylic dianhydride or its derivative formed by adding 2 mols or less of a monovalent saturated alcohol to 1 mol of the tetracarboxylic dianhydride, B mol of a diamine and C mol of an aminosilicon compound represented by the formula (1)

$$H_2N-R^1-SiR^2{}_{3-k}X_k \qquad (1)$$

{wherein $R^1$ is $-(CH_2)_s-$,

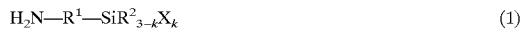

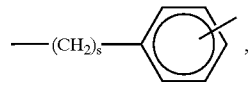

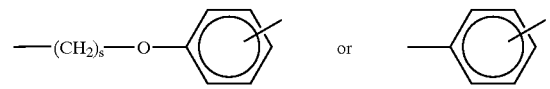

(wherein s is an integer of from 1 to 4); $R^2$ is independently an alkyl group having 1 to 6 carbon atoms, a phenyl group or a phenyl group substituted by an alkyl group having 7 to 12 carbon atoms; X is a hydrolytic alkoxy group; and k is $1 \leq k \leq 3$} in a ratio meeting the following formulae (2) and (3)

$$1 \leq \frac{C}{A-B} \leq 2.5 \qquad (2)$$

$$0.1 \leq \frac{C}{B+C} \leq 1 \qquad (3)$$

a silicon-containing polyamic acid ester (b) obtained by esterifying the precursor (a) with a monovalent saturated alcohol, and a partially esterified silicon-containing polyamic acid ester (c) obtained by partially esterifying the precursor (a) with the monovalent saturated alcohol.

20 Claims, No Drawings

PHOTOSENSITIVE POLYMIDE PRECURSOR RESIN COMPOSITION

This is a continuation of application Ser. No. 08/199,001, filed Feb. 18, 1994, now abandoned. This is a continuation of application Ser. No. 08/400,506 filed on Mar. 7, 1995, now abandoned.

BACKGROUND OF THE INVENTION (i) Field of the Invention

The present invention relates to a photosensitive resin composition. More specifically, it relates to a negative type photosensitive resin composition having excellent sensitivity and resolving properties which can inhibit volume shrinkage at the time of curing, can suitably adhere to a substrate, and can form a polyimide coating film pattern having good heat resistance on the substrate by baking.

(ii) Description of the Related Art

Photosensitive polyimides which are heat-resistant photosensitive materials have been widely used as insulating films and passivation films for semiconductors. The well known. photosensitive polyimides can be prepared by mixing a polyimide precursor with a compound having a carbon-carbon double bond capable of polymerizing by light irradiation, or chemically bonding the above-mentioned compound to the above-mentioned precursor by an ester linkage. For example, they are disclosed in Japanese Patent Application Laid-open Nos. (Sho)54-145794 and (Hei)2-144539, and Japanese Patent Publication No. (Sho)55-41422. However, in all of these polyimides, it is necessary to introduce a large amount, 50% by weight or more, of-the compound having the carbon-carbon double bond into the polyimide precursor in order to practically carry out patterning, so that deterioration of resolving properties and large volume shrinkage at curing cannot be avoided. On the other hand, there has also been suggested a method in which instead of the compound having a carbon-carbon double bond, a compound for generating an acid by light irradiation is used, whereby the above-mentioned problems can be solved. For example, Japanese Patent Application Laid-open No. 3-763 discloses a method which comprises blending the compound for generating an acid by light irradiation with a polyimide having an acyloxy group, and Japanese Patent Application Laid-open No. 4-120171 discloses a method which comprises blending the above-mentioned compound with a polyamic acid derivative into which an organic group is introduced by an ester linkage, whereby the formation of a positive type pattern can be achieved. These compositions obtained by these methods have excellent sensitivity and can inhibit the volume shrinkage at the time of curing, but the adhesion of them to the substrate is so poor that they are not practical.

SUMMARY OF THE INVENTION

An object of the present invention is to provide a negative type photosensitive resin composition having excellent sensitivity and resolving properties which inhibits volume shrinkage at the time of curing, possesses good adhesion to a substrate and can be baked.

The present inventors have intensively conducted investigation with the intention of solving the above-mentioned problems of known techniques, and as a result, they have found that these problems can be solved by a composition comprising a specific polyimide precursor whose molecular terminal has been reacted with an aminosilicon compound having a hydrolytic alkoxy group bonded to a silicon atom, and a compound for generating an acid with the aid of light. In consequence, the present invention has now been completed.

(1) A photosensitive resin composition of the present invention is characterized by a compound for generating an acid by light irradiation and at least one polyimide precursor selected from the group consisting of; (a) a silicon-containing polyimide precursor obtained from A mols of a tetracarboxylic dianhydride or its derivative formed by adding 2 mols or less of a monovalent saturated alcohol to 1 mol of the tetracarboxylic dianhydride, B mol of a diamine and C mols of an aminosilicon compound represented by the formula (1)

$$H_2N-R^1-SiR^2{}_{3-k}X_k \qquad (1)$$

{wherein $R^1$ is $-(CH_2)_s-$,

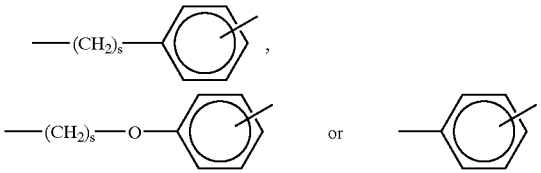

(wherein s is an integer of from 1 to 4); $R^2$ is independently an alkyl group having 1 to 6 carbon atoms, a phenyl group or a phenyl group substituted by an alkyl group having 7 to 12 carbon atoms; X is a hydrolytic alkoxy group; and k is $1 \leq k \leq 3$}
in a ratio meeting the following formulae (2) and (3)

$$1 \leq \frac{C}{A-B} \leq 2.5 \qquad (2)$$

$$0.1 \leq \frac{C}{B+C} \leq 1, \qquad (3)$$

(b) a silicon-containing polyamic acid ester obtained by esterifying the precursor (a) with a monovalent saturated alcohol, and (c) partially esterified silicon-containing polyamic acid ester obtained by partially esterifying the precursor (a) with the monovalent saturated alcohol.

As further preferable embodiments, (2) the photosensitive resin composition described in the preceding paragraph (1) wherein the silicon-containing polyimide precursor (a) is a silicon-containing polyamic acid.

(3) The photosensitive resin composition described in the preceding paragraph (1) wherein the silicon-containing polyimide precursor (a) is a polyamic acid ester.

(4) The photosensitive resin composition described in the preceding paragraph (1) wherein the polyimide precursor is the silicon-containing polyamic acid ester (b).

(5) The photosensitive resin composition described in the preceding paragraph (1) wherein the silicon-containing polyimide precursor (a) is a partially esterified polyamic acid ester.

(6) The photosensitive resin composition described in the preceding paragraph (1) wherein the polyimide precursor is the partially esterified silicon-containing polyamic acid ester (c).

(7) The photosensitive resin composition described in the preceding paragraph (1) wherein the partially esterified silicon-containing polyamic acid ester (c) is the partially esterified silicon-containing polyamic acid ester (c) which is partially imidated as much as less than 40%.

(8) The photosensitive resin composition described in the preceding paragraph (1) wherein the monovalent saturated alcohol is a monovalent saturated alcohol having 1 to 7 carbon atoms.

(9) The photosensitive resin composition described in the preceding paragraph (1) wherein X of the aminosilicon compound represented by the formula (1) is an alkoxyl group having 1 to 4 carbon atoms, and $R^1$ is a phenylene group or a trimethylene group.

(10) The photosensitive resin composition described in the preceding paragraph (1) wherein the tetracarboxylic dianhydride is represented by the formula (4)

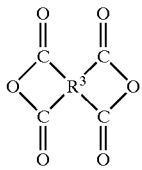
(4)

the diamine is represented by the formula (5)

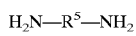
$H_2N-R^5-NH_2$ (5)

the main chain of the polyimide precursor comprises e mols, f mols, n mols, m mols, h mols and i mols (each of e, f, n, m, h and i is 0 or a positive integer) of constitutional units represented by the formulae (6), (7), (8), (9), (10) and (11), respectively,

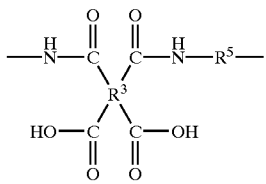
(6)

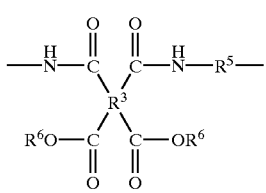
(7)

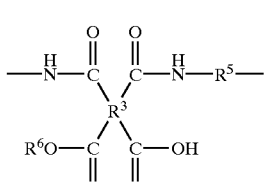
(8)

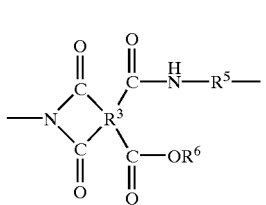
(9)

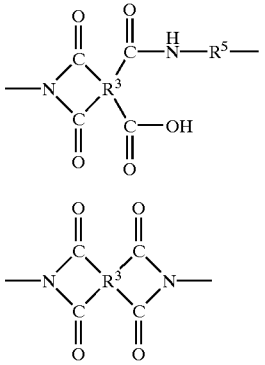
(10)

(11)

and e, f, n, m, h and i meet the equation (12)

$$0 \leq 100 \times \frac{m+h+2i}{2(e+f+n+m+h+i)} < 40 \quad (12)$$

(each $R^3$ is independently a tetravalent carbocyclic aromatic group, a heterocyclic group, an alicyclic group or an aliphatic group; each $R^5$ is independently a divalent aliphatic group having 2 or more carbon atoms, an alicyclic group, an aromatic aliphatic group, a carbon cyclic aromatic group, a heterocyclic group or a polysiloxane group; and $R^6$ is an alkyl group having 1 to 7 carbon atoms).

(11) The photosensitive resin composition described in the preceding paragraph (1) wherein the amount of the compound for generating an acid by light irradiation is in the range of from 0.5 to 15 parts by weight based on 100 parts by weight of the polyimide precursor.

DETAILED DESCRIPTION OF PREFERRED EMBODIMENT

The polyimide precursor which can be used in the photosensitive resin composition of the present invention is a specific silicon-containing polyimide precursor, a silicon-containing polyamic acid, a silicon-containing polyamic acid ester or a partially esterified silicon-containing polyamic acid.

The polyimide precursor which can be used in the photosensitive resin composition of the present invention can be obtained by carrying out a reaction for forming an amide bond between molecules of a tetracarboxylic dianhydride, its derivative formed by adding a monovalent saturated alcohol to the tetracarboxylic dianhydride or a mixture thereof, a diamine and the above-mentioned aminosilicon compound at a temperature of from 0 to 100° C., preferably from 10 to 60° C. in a polar solvent, or alternatively, after this reaction, further carrying out esterification.

The tetracarboxylic dianhydride which can be used herein is represented by the formula (4)

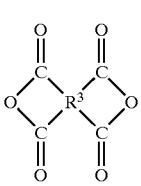
(4)

and its derivative obtained by adding 2 mols or 1 mol of a monovalent saturated alcohol to 1 mol of the tetracarboxylic dianhydride is represented by the formula (13) or (14)

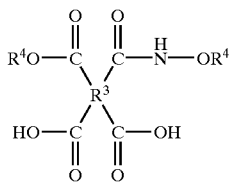
(13)

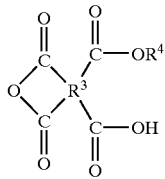
(14)

{wherein each $R^3$ is independently a tetravalent organic group such as a tetravalent carboncyclic aromatic group, a heterocyclic group, an alicyclic group or an aliphatic group; and $R^4$ is an alkyl group having 1 to 7 carbon atoms}.

The smaller the number of the carbon atoms of $R^4$ is, the smaller the volume shrinkage of the polyimide precursor at baking is. Examples of the preferable $R^4$ include a methyl group, an ethyl group, a propyl group and a butyl group.

As the diamine, a compound represented by the formula (5)

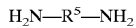
$H_2N—R^5—NH_2$ (5)

can be used {wherein $R^5$ is a divalent organic group having 2 or more carbon atoms such as a divalent aliphatic group, an alicyclic group, an aromatic aliphatic group, a carbon cyclic aromatic group, a heterocyclic group or a polysiloxane group}.

Moreover, as the aminosilicon compound, a compound represented by the formula (1) can be used. In order to decrease the volume shrinkage of the polyimide precursor at the time of baking, X in the formula (1) is preferably the alkoxy group having a small number of carbon atoms. Examples of the preferable X include methoxy, ethoxy, propoxy and butoxy.

As the reaction for forming the amide bond between the molecules, there can be applied an addition reaction of the tetracarboxylic dianhydride and the amine, or a known reaction in which a dehydrating agent or a condensation agent such as N,N'-dicyclohexylcarbodiimide, N-ethoxycarbonyl-2-ethoxy-1,2-dihydroquinoline, N,N'-carbonyldiimidazole and the like is allowed to act on between the amine and the derivative formed by adding the monovalent saturated alcohol to the tetracarboxylic dianhydride. At this time, a mixing ratio of the tetracarboxylic dianhydride or the derivative formed by adding the alcohol to the tetracarboxylic dianhydride, the diamine and the aminosilicon compound which are reaction components is required to meet the above-mentioned formulae (2) and (3). If the amounts of the respective components deviate from the range of the formula (2), the viscosity of the obtained silicon-containing polyimide precursor noticeably changes with time, and shelf stability is poor. If C/(C+B) in the formula (3) is less than 0.1, sufficient photosensitivity cannot be obtained, and adhesion to the substrate is also poor.

When the silicon-containing polyimide precursor has an esterifiable portion such as a carboxyl group in its molecule, this portion can be further esterified, if necessary. The esterification or the partial esterification can be achieved by reacting the portion of the carboxyl group in the polyimide precursor with a dehydrating agent such as N,N'-dicyclohexylcarbodiimide, N-ethoxycarbonyl-2-ethoxy-1,2-dihydroquinoline and the like to convert the same into such an isoimide as shown in the following,

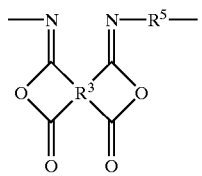

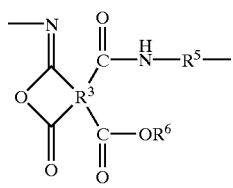

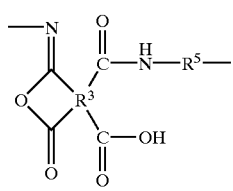

and then adding a saturated alcohol having 1 to 7 carbon atoms to the isoimide. At this time, the suitably usable alcohol is methanol, ethanol, propanol or butanol. The degree of the esterification can be changed in a wide range by controlling the amount of the isoimide which depends upon the amount of the dehydrating agent.

When the carboxyl group of the silicon-containing polyimide precursor is converted into the isoimide, imidation occurs partially owing to a side reaction, but the amount of the resulting imide is limited, which does not substantially have an influence on the present invention.

The silicon-containing polyimide precursor (a) obtained by meeting the relations (2) and (3) in the composition of the present invention contains a polyamic acid, a polyamic acid ester, a partially esterified polyamic acid ester.

The main chain of the polyimide precursor which can be used in the thus obtained photosensitive resin composition of the present invention comprises e mol, f mol, n mol, m mol, h mol and i mol (wherein each of e, f, n, m, h and i is 0 or a positive integer) of constitutional units represented by the formulae (6), (7), (8), (9), (10) and (11)

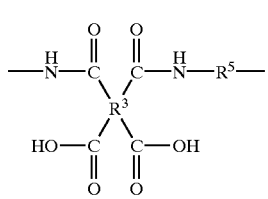
(6)

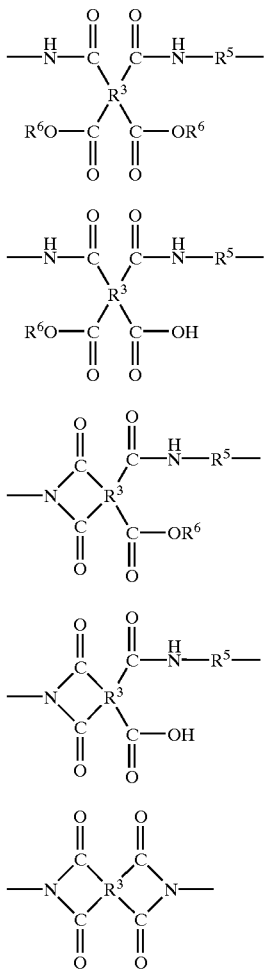

(7)

(8)

(9)

(10)

(11)

(wherein each $R^3$ is independently a tetravalent organic group such as a tetravalent aromatic group, a heterocyclic group, an alicyclic hydrocarbon group or an aliphatic hydrocarbon group; each $R^5$ is independently a divalent organic group having 2 or more carbon atoms such as a divalent aliphatic group, an alicyclic group, a carbon cyclic aromatic group, a heterocyclic group or a polysiloxane group; and $R^6$ is an alkyl group having 1 to 7 carbon atoms, and may be the same as or different from above-mentioned $R^4$), and these constitutional units meet the equation (12)

$$0 \leq 100 \times \frac{m+h+2i}{2(e+f+n+m+h+i)} < 40 \qquad (12)$$

When f+n≠0, the precursor has an ester chain, but 100 (2f+n+m)/2(e+f+n+m+h+i) designates a content ratio (%) of an ester side chain. The closer to 100, the value of this content ratio is, the higher the content ratio of the ester side chain is, and along with the increase of the content ratio value, the change with time of viscosity is inhibited. In consequence, shelf stability is improved, and heat stability at the time of patterning is also improved, whereby sensitivity can be improved, keeping resolution good. In addition, 100(m+h+2i)/2(e+f+n+m+h+i) corresponds to an imidation ratio.

Every polyimide precursor which can be used in the photosensitive resin composition of the present invention can be converted into a silicon-containing polyimide whose main chain is constituted of a common structural unit represented by the formula

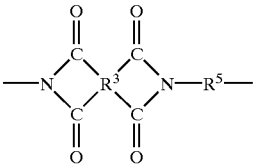

by baking, even if the carboxyl group and the ester portion in the precursor are present in any ratios. Therefore, the ratios of the carboxyl group and the ester structure in the polyimide precursor can be selected in compliance with a particular application.

In the polyimide precursor obtained by the above-mentioned method, the aminosilicon compound of the formula (1) is introduced into its molecular terminal, and so the precursor has a hydrolytic alkoxyl group bonded to a silicon atom at the molecular terminal. Such an alkoxyl group at the molecular terminal can form a siloxane bond as in the formula

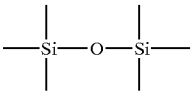

between the molecular terminals by condensation. This condensation can be accelerated by an acid or heat, if necessary.

In addition, the logarithmic viscosity number of this polyimide is suitably in the range of from 0.1 to 5 dl/g from the viewpoint of film formation properties. Here, the logarithmic viscosity number is $\eta_{inh}$ represented by the formula (V)

$$\eta_{inh} = \frac{l_n \eta / \eta_o}{C} \qquad (V)$$

(wherein $\eta$ and $\eta_0$ are values measured at a temperature of 30±0.01° C. in a solution and in N-methyl-2-pyrrolidone, respectively, by the use of a Ubbelohde's viscometer; and C is a solution concentration, i.e., 0.5 g/dl).

When the thus obtained polyimide precursor is blended with the compound for generating an acid by light irradiation, the photosensitive resin composition of the present invention can be obtained.

The amount of the compound for generating an acid by light irradiation to be blended is in the range of from 0.01 to 30 parts by weight, preferably from 0.5 to 15 parts by weight with respect to 100 parts by weight of the above-mentioned polyimide precursor. If the amount of this compound is less than 0.01 part by weight, the sensitivity is low, and if it is more than 30 parts by weight, the film quality of the cured polyimide deteriorates unpreferably.

Next, reference will be made to the tetracarboxylic dianhydride (a'), the diamine (b'), the aminosilicon compound (c') and the polar solvent (d') which are reaction components for obtaining the silicon-containing polyimide precursor in the composition of the present invention.

Typical examples of the tetracarboxylic dianhydride (a') are the following known compounds, but they are not restrictive. That is, they include aromatic tetracarboxylic dianhydrides such as pyromellitic dianhydride, 3,3',4,4'-biphenyltetracarboxylic dianhydride, 2,2',3,3'-biphenyltetracarboxylic dianhydride, 2,3,3',4'-biphenyltetracarboxylic dianhydride, 3,3',4,4'- benzophenonetetracarboxylic dianhydride, 2,2',3,3'-benzophenonetetracarboxylic dianhydride, 2,3,3',4'-benzophenonetetracarboxylic dianhydride, bis(3,4-dicarboxyphenyl) ether dianhydride, bis(3,4-dicarboxyphenyl)sulfone dianhydride, 1,2,5,6-naphthalenetetracarboxylic dianhydride, 2,3,6,7-naphthalenetetracarboxylic dianhydride, 2,2-bis(3,4-dicarboxyphenyl)-hexafluoropropane dianhydride and the like; alicyclic tetracarboxylic dianhydrides such as cyclobutanetetracarboxylic dianhydride, methylcyclobutanetetracarboxylic dianhydride and the like; and aliphatic tetracarboxylic dianhydride such as 1,2,3,4-tetracarboxybutane dianhydride and the like.

Typical examples of the derivative obtained by adding a saturated alcohol to the tetracarboxylic dianhydride which can be used in the present invention include those which can be obtained by adding saturated alcohols having 1 to 7 carbon atoms such as methanol, ethanol, propanol, butanol, pentanol, hexanol, heptanol and the like to the above-mentioned typical examples of the tetracarboxylic dianhydrides.

Typical examples of the diamine (b') are the following compounds, but they are not restrictive. That is, they include aromatic diamines such as 4,4'-diamino diphenyl ether, 3,4'-diamino diphenyl ether, 4,4'-diaminodiphenylmethane, 4,4'-diaminodiphenylsulfone, 4,4'-diaminodiphenyl sulfide, 4,4'-di(metaaminophenoxy)diphenylsulfone, 4,4'-di(paraaminophenoxy)diphenylsulfone, orthophenylenediamine, metaphenylenediamine, paraphenylenediamine, benzidine, 3,3'-diaminobenzophenone, 4,4'-diaminobenzophenone, 4,4'-diaminodiphenyl-2,2-propane, 1,5-diaminonaphthalene, 1,8-diaminonaphthalene, 4,4'-bis(4-aminophenoxy)biphenyl, 2,2-bis{4-(4-aminophenoxy)phenyl}-hexafluoropropane, 1,4-bis(4-aminophenoxy)benzene, 1,3-bis(4-aminophenoxy)benzene, 4,4'-diamino-3,3'-diethyl-5,5'-dimethyldiphenylmethane, 4,4'-diamino-3,3',5,5'-tetramethyldiphenylmethane, 1,4-diaminotoluene, metaxylylenediamine, 2,2'-diamehylbenzidine and the like; aliphatic diamines such as trimethylenediamine, tetramethylenediamine, hexamethylenediamine, 2,11-dodecanediamine and the like; silicon-based diamines such as bis(paraaminophenoxy)dimethylsilane, 1,4-bis(3-aminopropyldimethylsilyl)benzene and the like; alicyclic diamines such as 1,4-diaminocyclohexane, bis(4-aminocyclohexyl)methane, isophoronediamine and the like; guanamines such as acetoguanamine, benzoguanamine and the like.

As the diamine, a diaminopolysiloxane can also be used, but its examples include compounds represented by the formulae (wherein p is in the range of from 1 to 100):

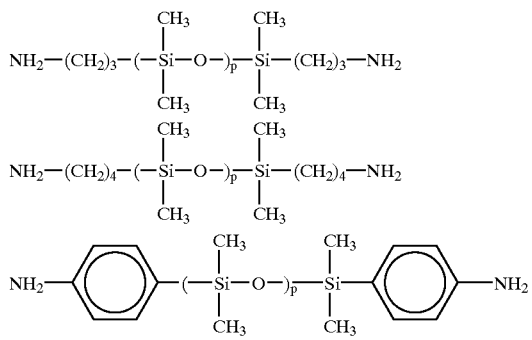

-continued

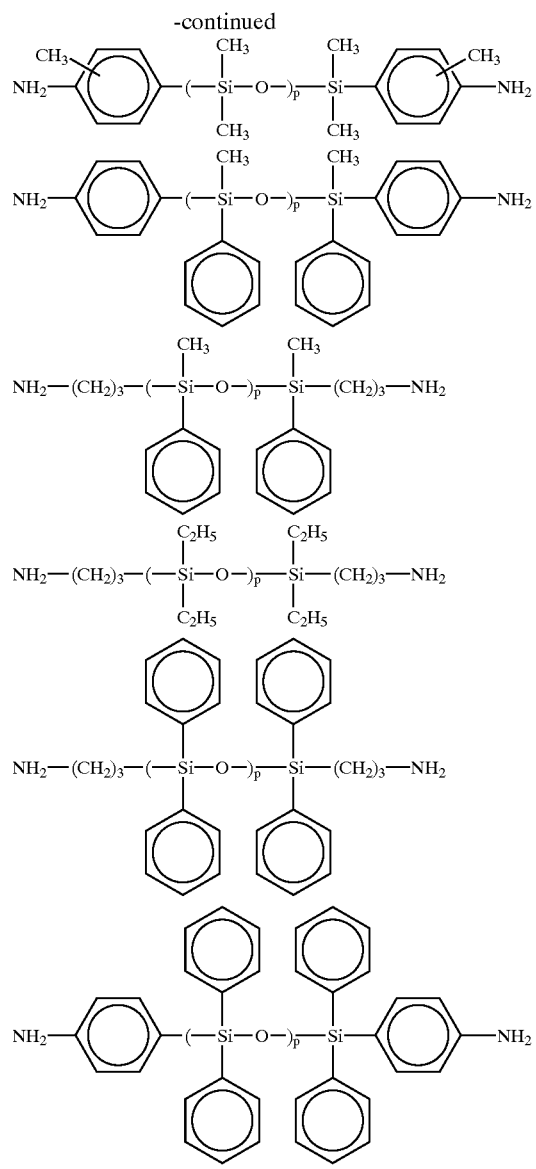

Known diamines other than mentioned above can also be widely used.

Typical examples of the aminosilicon compound (c') are the following compounds, but they are not always restrictive. That is, they include aminomethyl-di-n-propoxy-methylsilane, (β-aminoethyl)-di-n-propoxy-methylsilane, (β-aminoethyl)-diethoxyphenylsilane, (β-aminoethyl)-tri-n-propoxysilane, (β-aminoethyl)-dimethoxy-methylsilane, (γ-aminopropyl)-di-n-propoxy-methylsilane, (γ-aminopropyl)-di-n-butoxy-methylsilane, (γ-aminopropyl)-trimethoxysilane, (γ-aminopropyl)-triethoxysilane, (γ-aminopropyl)-di-n-pentoxy-phenylsilane, (γ-aminopropyl)-methoxy-n-propoxy-methylsilane, (δ-aminobutyl)-dimethoxy-methylsilane, (3-aminophenyl)-di-n-propoxy-methylsilane, (4-aminophenyl)-tri-n-propoxysilane, [β-(4-aminophenyl)-ethyl]-diethoxy-methylsilane, [β-(3-aminophenyl)-ethyl]-di-n-propoxy-methylsilane, [γ-(4-aminophenyl)-propyl]-di-n-propoxy-methylsilane, [γ-(4-aminophenoxy)-propyl]-di-n-propoxy-methylsilane, [γ-(3-aminophenoxy)-propyl]-di-n-butoxy-methylsilane, (γ-aminopropyl)-methyl-dimethoxysilane, (γ-aminopropyl)-methyl-diethoxysilane, (γ-aminopropyl)-ethyl-di-n-propoxysilane, 4-aminophenyl-trimethoxysilane, 3-aminophenyl-trimethoxysilane, 4-aminophenyl-methyl-di-methoxysilane, 3-aminophenyl-dimethyl-methoxysilane, 4-aminophenyl-triethoxysilane and the like.

Typical examples of the solvent (d'), in which the above-mentioned reaction components (a'), (b') and (c') are reacted, include N-methyl-2-pyrrolidone, N,N-dimethylacetamide, N,N-dimethylformamide, dimethyl sulfoxide, tetramethyl urea, pyridine, hexamethylphosphoramide, methylformamide, N-acetyl-2-pyrrolidone, 2-methoxyethanol, 2-ethoxybutanol, 2-butoxyethanol, diethylene glycol monomethyl ether, diethylene glycol monoethyl ether, diethylene glycol monobutyl ether, cyclopentanone, cresol, γ-butyrolactone, isophorone, N,N-diethylacetamide, N,N-diethylformamide, N,N-dimethylmethoxyacetamide, tetrahydrofuran, N-methyl-ε-caprolactam, tetrahydrothiophene dioxide (sulpholane) and the like.

The above-mentioned polar solvents can be diluted with another non-protonic (neutral) organic solvent, and examples of such an organic solvent include aromatic, alicyclic and aliphatic hydrocarbons and chlorinated derivatives thereof (benzene, toluene, xylene, cyclohexane, pentane, hexane, petroleum ether, methylene chloride etc.), alcohols and dioxanes.

As the compound for generating an acid by light irradiation which can be used in the composition of the present invention, many known compounds and mixtures thereof can be used. Typical examples of these compounds include onium compounds such as ammonium salts, diazonium salts, iodonium salts, sulfonium salts, selenium salts, arsonium salts and the like; organic halogen compounds such as phenyltrihalomethylsulfone compounds, halomethyltriazine compounds, halomethyloxadiazole compounds and the like; and sulfonic acid-generating agents such as esters or amide compounds of 1,2-naphthoquinonediazido-(2)-4-sulfonic acid, sulfonic acid ester compounds of nitrobenzyl alcohols, sulfonic acid ester compounds of oximes, sulfonic acid ester compounds of N-hydroxyamides or imides, β-ketosulfone compounds, and sulfonic acid ester compounds of benzoin and the like.

Typical examples of the above-mentioned compounds are the following compounds the invention is not to be construed as being limited thereto. That is, they include di(paratertiarybutylbenzene) diphenyliodonium trifluoromethane sulfonate, diphenyliodonium tetrafluoroborate, diphenyliodonium hexafluorophosphate, diphenyliodonium trifluoromethane sulfonate, benzenediazoniumparatoluene sulfonate, 4-p-tryl-mercapto-2,5-diethoxy-benzenediazonium hexafluorophosphate, diphenylamine-4-diazonium sulfate, tri(tertiarybutylphenyl)sulfonium trifluoromethane sulfonate, triphenylsulfonium trifluoromethane sulfonate, triphenylselenium tetrafluoroborate, orthonitrobenzylparatoluene sulfonate, benzoin tosylate, benzoinmethane sulfonate, benzointrifluoromethane sulfonate, benzoin-2-trifluoromethanebenzene sulfonate, anisoin tosylate, anisoinmethane sulfonate, anisointrifluoromethane sulfonate, anisoin-2-trifluoromethanebenzene sulfonate, 1-benzoyl-1-methylsulfonyloxy-cyclohexane, 2-[(p-tolylsulfonyl)oxy]-1-phenyl-1-octanone, 2-[(β-naphthylsulfonyl)oxy]-1-phenyl-1-propanone, 2-[(p-acetoamidophenylsulfonyl)oxy]-1-phenyl-1-propanone, benzamido tosylate, benzamidomethane sulfonate, N-tosyloxyphthalimide, N-[(2-trifluoromethanebenzenesulfonyl)oxy]phthalimide, N-tosyloxy-1,8-naphthalimide, N-[(2-trifluoromethanebenzenesulfonyl)oxy]-1,8-naphthalimide, N-tosyloxy-2,3-diphenylmaleimide, N-[(2-trifluoromethanebenzenesulfonyl)oxy]-2,3-diphenylmaleimide, 4-(di-n-propylamino)-benzonium tetrafluoroborate, 4-methyl-6-trichloromethyl-2-pyrrone, 4-(3,4,5-trimethoxystyryl)-6-trichloromethyl-2-pyrrone, 4-(4-methoxystyryl)-6-(3,3,3-trichloropropenyl)-2-pyrrone, 2-trichloromethylbenzimidazole, 2-tribromomethylquinone, 2,4-dimethyl-1-tribromoacetylbenzene, 4-dibromoacetylbenzoic acid, 1,4-bisdibromomethyl-benzene, tris-dibromomethyl-s-triazine, 2-(6-methoxy-naphthyl-2-yl)-4,6-bis-trichloromethyl-s-triazine, 2-(naphthyl-1-yl)-4,6-bis-trichloro-s-triazine, 2-(naphthyl-2-yl)-4,6-bis-trichloromethyl-s-triazine, 2-(4-ethoxynaphthyl-1-yl)-4,6-bis-trichloromethyl-s-triazine, 2-(benzopyranyl-3-yl)-4,6-bis-trichloromethyl-s-triazine, 2-(4-methoxy-antracen-1-yl)-4,6-bis-trichloromethyl-s-triazine, 2-(phenethyl-9-yl)-4,6-bis-trichloromethyl-s-triazine, 2-phenyl-5-trichloromethyloxadiazole, 2-(p-methoxyphenyl)-5-trichloromethyloxadiazole, 2-styryl-5-trichloromethyloxadiazole, 2-(n-butyl)-5-trichloromethyloxadiazole, α-trifluoroacetophenoneoxime-4-hydroxybenzene sulfonate, 9-(4-hydroxybenzenesulfonyloxyimino)-fluorene, 9-(4-methacylamidomethylbezenesulfonyloxyimino)-fluorene, 2-(4-methoxystyryl)-4,6-bis-(trichloromethyl)-s-triazine, diphenyl(4-thiophenoxyphenyl)-sulfoniumhexafluoro antimonate, (4-methoxyphenyl)phenyliodonium trifluoromethane sulfonate, 2,6-dinitrobenzyl tosylate, N-[(methanesulfonyl)oxy]-2-(α-naphthyl)-3-phenyl-maleimide, N-[(trifluoromethanesulfonyl)oxy]-2-(α-naphthyl)-3-phenylmaleimide and the like. However, these compounds are not restrictive.

Furthermore, in the photosensitive resin composition of the present invention, a sensitizing agent, a dye, a pigment, a surface active agent and the like can be used, if necessary.

The photosensitive resin composition of the present invention is usually supplied in the state of a solution. This photosensitive resin composition is applied to a substrate, and after the removal of the solvent, the composition on the substrate is irradiated with light to generate an acid. The thus generated acid functions as a catalyst, so that condensation proceeds between the alkoxy groups of the aminosilicon compound introduced into the silicon-containing polyimide precursor (polyimide precursor). As a result, the portion which has undergone the light irradiation becomes insoluble in any of the organic solvents mentioned above as the examples of the reaction solvents or an aqueous alkaline solution, and by the utilization of this fact, a relief pattern of a negative type silicon-containing polyimide precursor (negative type polyimide precursor) can be formed. In the thus obtained patterned silicon-containing polyimide precursor (polyimide precursor) and a cured material subjected to imidation by heating and dehydration or alcohol-removal and condensation between the alkoxy groups, an aminosilicon compound which contributes to the adhesion to the substrate is introduced into the polymer, and therefore the adhesion to the substrate is excellent and a substrate treatment using a coupling agent is not required any more. In addition, since the photosensitivity can be given only by blending a small amount of the compound for generating the acid with the aid of light, the volume shrinkage at the time of curing can be inhibited.

Next, reference will be made to procedures for forming the patterned silicon-containing polyimide precursor (polyimide precursor) and the silicon-containing polyimide by the use of the photosensitive resin composition of the present invention.

The photosensitive resin composition of the present invention can be applied to a substrate such as a silicon wafer, a metal plate, a plastic plate or a glass plate by a known means such as spin coating, immersion, printing, dispensing, roll coating and the like. The resultant coating film is prebaked at a temperature of from 30 to 150° C., preferably from 60 to 110° C. for a period of several minutes to several of minutes by the use of a heating means such as an electric furnace, a hot plate and the like to remove most of the solvent in the coating film therefrom.

Afterward, a negative mask is put on this coating film, followed by irradiation with chemical rays. Examples of the chemical rays include X rays, electron beams, ultraviolet rays and visible light, but ultraviolet rays and electron beams are particularly desirable. In succession, if necessary, the curing due to the condensation with the acid generated by the light irradiation can be accelerated by heating the coating film at a temperature of from 30 to 200° C., preferably from 60 to 190° C. for a period of from 30 seconds to 15 minutes by means of the above-mentioned heating means.

Next, the unexposed portion is removed from the coating film by a developing agent to obtain a relief pattern. Examples of the developing solution used herein include the organic solvents mentioned above as the reaction solvents and mixtures of these solvents and poor solvents such as alcohols, xylene, water and the like. In addition to the above-mentioned organic solvents, there can also be used, as the developing solution, aqueous solutions of inorganic alkalis such as sodium hydroxide, potassium hydroxide, sodium carbonate, sodium silicate, sodium metasilicate and ammonia; aqueous solutions of organic amines such as ethylamine, n-propylamine, diethylamine, di-n-propylamine, triethylamine, methyldiethylamine, tetramethylammonium hydroxide, trimethylhydroxyethylammonium hydroxide and the like, and, in some cases, solutions formed by mixing these aqueous solutions with alcohols. Next, if necessary, the coating film is rinsed in a poor solvent such as an alcohol, water and the like, and then dried at a temperature of 150° C. or less. At any point of time after the prebaking, the film is peeled from the substrate, and it can also be used as a single film.

The silicon-containing polyimide precursor (polyimide precursor) of the relief pattern formed by the development is in the form of the precursor of a polyimide, and so it is heated at a temperature of from 200 to 500° C., preferably from 300 to 400° C. for a period of from several minutes to several of minutes by the above-mentioned heating means, whereby the polyimide precursor is dehydrated or is removed to close a ring and to thereby perform imidation, and in the portion of the aminosilicon compound, the condensation of the alkoxy groups proceeds, so that a patterned silicon-containing polyimide film is formed.

In accordance with such a procedure, the patterned heat-resistant silicon-containing polyimide film can be obtained from the photosensitive resin composition of the present invention. The photosensitive resin composition of the present invention can be applied to electronic materials, particularly various kinds of protective films for semiconductors, flattened films, passivation films, buffer coat films, α-ray shield films for LSI memories, interlayer insulating films, interlayer films of multi-layer plates of printed-wiring boards, aligned films of liquid crystals heat storage materials of thermal heads, and the like.

The photosensitive resin composition of the present invention can be easily manufactured by a method described in this specification, and a negative type sharp relief pattern can be formed from the composition. In addition, the decrease or shrinkage of a film at the time of curing by baking is small, and the adhesive properties of the film to a substrate are excellent.

EXAMPLES

Now, the present invention will be described in detail, but the scope of the present invention should not be construed as being limited to these examples.

Synthetic Example 1
[Synthesis of a Silicon-containing Polyimide Precursor (a) (a Polyamic Acid)]

A one-liter flask equipped with a stirrer, a dropping funnel, a thermometer, a condenser and a nitrogen-replacing device was fixed in a thermostatic chamber. Next, 500 g of dehydrated and purified N-methyl-2-pyrrolidone (hereinafter abbreviated to "NMP"), 32.69 g (0.1633 mol) of 4,4'-diamino diphenyl ether (hereinafter abbreviated to "DDE") and 13.93 g (0.0653 mol) of 4-aminophenyltrimethoxysilane (hereinafter abbreviated to "APMS") were poured into the flask, and they were continuously stirred to dissolve them. To the resulting solution was added 63.13 g (0.1959 mol) of 3,4,3',4'-benzophenonetetracarboxylic dianhydride (hereinafter abbreviated to "BTDA"), and reaction was then carried out at 20 to 30° C. for 8 hours to obtain a silicon-containing polyamic acid at a concentration of 18.0 wt % having 4-aminophenyltrimethoxysilane added at terminals.

Synthetic Examples 2 to 7
[Synthesis of a Silicon-containing Polyimide Precursor (a) (a Polyamic Acid)]

The same devices, solvent and procedure as in Synthetic Example 1 were utilized except for the amounts of reaction components to obtain various silicon-containing polyamic acid solutions.

With regard to the synthetic examples, there are shown in Table 1, each mole of tetracarboxylic dianhydride, diamine and aminosilicon compound, the concentration of silicon-containing polyamic acid in solution, and each value of C/A−B and C/B+C.

Synthetic Example 8
[Synthesis of a Derivative to Which a Monovalent Saturated Alcohol was Added (a Derivative in Which an Alcohol was Added to Tetracarboxylic Dianhydride)]

200 g of pyromellitic anhydride and 500 ml of ethanol were placed in one-liter flask equipped with a stirrer, a thermometer and a condenser, and they were then heated and stirred at 70° C. for 3 hours. After cooling, the resulting crystals were removed by filtration, and recrystallization was then carried out from ethanol to obtain 84 g of a derivative in which ethanol was added to pyromellitic anhydride.

Synthetic Example 9
[Synthesis of a Derivative to Which a Monovalent Saturated Alcohol was Added (a Derivative in Which an Alcohol was Added to Tetracarboxylic Dianhydride)]

180 g of BTDA and 250 g of n-propanol were placed in one-liter flask equipped with a stirrer, a thermometer and a condenser, and they were then heated and stirred at 90° C. for 4 hours. After cooling, excessive n-propyl alcohol was distilled off from the resulting reaction mixture by an evaporator, and the mixture was then dried by a vacuum dryer to obtain 247 g of a derivative in which n-propanol was added to BTDA.

Synthetic Example 10
[Synthesis of a Silicon-containing Polyimide Precursor (a) (a Polyamic Acid Ester)]

A 500-ml flask equipped with a stirrer, a dropping funnel, a thermometer, a condenser and a nitrogen-replacing device were fixed in a thermostatic chamber. Next, 250 g of dehydrated and purified NMP, 36.89 g (0.1190 mol) of a derivative obtained in Synthetic Example 8 in which ethanol was added to pyromellitic anhydride, 22.23 g (0.1110 mol) of DDE and 3.39 g (0.0158 mol) of 4-aminophenyltrimethox-silane were poured into the flask, and they were continuously stirred to dissolve them. To the resulting solution was added 61.77 g (0.2500 mol) of N-ethoxycarbonyl-2-ethoxy-1,2-dihydroquinoline (hereinafter abbreviated to "EEDQ"), and reaction was then carried out at 40–50° C. for 8 hours to obtain a silicon-containing polyimide precursor (a) (a polyamic acid ester). Afterward, this solution was slowly poured into a large amount of methanol, so that a white precipitate occurred. This precipitate was collected by filtration, and then dried at 50° C. for 18 hours in a vacuum dryer to obtain a silicon-containing polyimide precursor (a) in which 4-aminophenyltrimethoxysilane was introduced into terminals of the precursor (polyamide acid ester).

Synthetic Example 11
[Synthesis of a Partially Esterified Silicon-containing Polyamic Acid Ester (c)]

The same device as in Synthetic Example 9 was assembled. Next, 250 g of dehydrated and purified N,N-dimethylacetamide (hereinafter abbreviated to "DMAc"), 13.43 g (0.0433 mol) of a derivative obtained in Synthetic Example 8 in which ethanol was added to pyromellitic anhydride, 33.18 g (0.0808 mol) of 2,2-bis{4-(4-aminophenoxy)phenyl}-propane (hereinafter abbreviated to "BAPP") and 2.46 g (0.0115 mol) of 4-aminophenyltrimethoxysilane were poured into the device, and they were then continuously stirred to dissolve them. To the resulting solution was added 21.42 g (0.0866 mol) of EEDQ, followed by continuously stirring the solution at 40 to 50° C. for 16 hours, to obtain a silicon-containing polyimide precursor (a) (a polyamic acid ester). To this solution was added 9.44 g (0.0433 mol) of PMDA, and reaction was then carried out at 20 to 30° C. for 4 hours. Furthermore, 22.49 g (0.0909 mol) of EEDQ was added to the solution, followed by stirring at 30 to 40° C. for 2 hours to perform isoimidation. To this solution was added 3.98 g (0.0865 mol) of ethanol, and reaction was then carried out at 40 to 50° C. for 8 hours to esterify the portion of an isoimide. Afterward, the thus treated solution was slowly poured into a large amount of ethanol, so that a white precipitate formed. This precipitate was collected by filtration, and then dried at 50° C. for 15 hours under reduced pressure to obtain a partially esterified silicon-containing polyamic acid ester (c) in which 4-aminophenyltrimethoxysilane was introduced into terminals of the ester.

Synthetic Example 12
[Synthesis of a Silicon-containing Polyimide Precursor (a) (a Polyamic Acid Ester)]

A 500-ml flask equipped with a stirrer, a dropping funnel, a thermometer, a condenser and a nitrogen-replacing device was fixed in a thermostatic chamber. Next, 250 g of dehydrated and purified NMP, 42.04 g (0.0950 mol) of a derivative obtained in Synthetic Example 9 in which n-propanol was added to BTDA, 17.75 g (0.0887 mol) of DDE and 2.70 g (0.0127 mol) of 4-aminophenyltrimethoxysilane were placed in the flask, and they were then continuously stirred to dissolve them. To this solution was added 41.16 g (0.1995 mol) of N,N'-dicyclohexylcarbodiimide (hereinafter abbreviated to "DCC"), and reaction was then carried out at 30 to 40° C. for 16 hours. Afterward, a secondarily produced urea compound was removed from this solution by filtration, and the filtrate was then slowly poured into a large amount of isopropanol, so that a white precipitate formed. This precipitate was collected by filtration, and then dried at 50° C. for 18 hours under reduced pressure to obtain a silicon-containing polyimide precursor (a) in which 4-aminophenyltrimethoxysilane was introduced into terminals (polyamic acid ester).

Synthetic Example 13
[Synthesis of a Partially Esterified Silicon-containing Polyamic Acid Ester (c)]

The same device as in Synthetic Example 9 was assembled. Next, 250 g of dehydrated and purified NMP, 8.60 g (0.0430 mol) of DDE and 18.32 g (0.0859 mol) of 4-aminophenyltrimethoxysilane were poured into the device, and they were then continuously stirred to dissolve them. To the resulting solution was added 27.68 g (0.0859 mol) of BTDA, and reaction was then carried out at 20 to 30° C. for 4 hours to obtain a polyamic acid in which 4-aminophenyltrimethoxysilane was added to terminals.

To this solution was added 42.48 g (0.1718 mol) of EEDQ, followed by stirring at 30 to 40° C. for 2 hours to perform isoimidation. Next, 7.90 g (0.1718 mol) of ethanol was added thereto, followed by stirring at 40 to 50° C. for 8 hours to perform esterification. Afterward, the thus treated solution was slowly poured into isopropanol, so that a white precipitate occurred. This precipitate was collected by filtration, and then dried at 50° C. for 15 hours in a vacuum dryer to obtain a partially esterified silicon-containing polyamic acid ester (c) in which 4-aminophenyltrimethoxysilane was added into terminals of the ester.

Synthetic Example 14
[Synthesis of a Partially Esterified Silicon-containing Polyamic Acid Ester (c)]

The same device as in Synthetic Example 9 was assembled. Next, 250 g of dehydrated and purified DMAc, 24.11 g (0.0557 mol) of BAPS and 7.59 g (0.0297 mol) of 4-aminophenyltriethoxysilane were poured into the device, and they were then continuously stirred to dissolve them. To the resulting solution was added 23.95 g (0.0743 mol) of BTDA, and reaction was then carried out at 20 to 30° C. for 4 hours to obtain a polyamic acid in which 4-aminophenyltriethoxysilane was added to terminals.

To this solution was added 23.95 g (0.1487 mol) of EEDQ, followed by stirring at 30 to 40° C. for 2 hours to perform isoimidation. Next, 6.84 g (0.1389 mol) of ethanol was added thereto, followed by stirring at 40 to 50° C. for 8 hours to perform esterification. Afterward, the thus treated solution was slowly poured into isopropanol, so that a white precipitate formed. This precipitate was collected by filtration, and then dried at 50° C. for 15 hours in a vacuum dryer to obtain a partially esterified silicon-containing polyamic acid ester (c) in which 4-aminophenyltriethoxysilane was added to terminals.

Synthetic Example 15
[Synthesis of a Partially Esterified Silicon-containing Polyamic Acid Ester (c)]

The same device as in Synthetic Example 9 was assembled. Next, 250 g of dehydrated and purified NMP, 12.03 g (0.0600 mol) of DDE and 5.00 g (0.0618 mol) of 4-aminophenyltri-n-propoxysilane were poured into the device, and they were then continuously stirred to dissolve them. To the resulting solution was added 15.72 g (0.0721 mol) of PMDA, and reaction was then carried out at 20 to 30° C. for 4 hours to obtain a polyamic acid in which 4-aminophenyltri-n-propoxysilane was added to terminals of the acid.

To this solution was added 29.73 g (0.1441 mol) of DCC, followed by stirring at 20 to 30° C. for 4 hours to perform isoimidation. Next, 18.45 g (0.5776 mol) of methanol was added thereto, followed by stirring at 40 to 50° C. for 8 hours to perform esterification. Afterward, a secondarily produced urea compound was removed from this solution by filtration, and the filtrate was then slowly poured into methanol, so that a white precipitate was obtained. This precipitate was collected by filtration, and then dried at 50° C. for 15 hours in a vacuum dryer to obtain a partially esterified silicon-containing polyamic acid ester (c) in which 4-aminophenyl-tri-n-propoxysilane was added to terminals of the ester.

Synthetic Example 16
[Synthesis of a Partially Esterified Silicon-containing Polyamic Acid Ester (c)]

The same device as in Synthetic Example 9 was assembled. Next, 250 g of dehydrated and purified NMP, 15.12 g (0.0368 mol) of BAPP and 1.16 g (0.0052 mol) of (γ-aminopropyl)-tri-methoxysilane were poured into the device, and they were then continuously stirred to dissolve them. To the resulting solution was added 17.52 g (0.0394 mol) of 2,2-bis(3,4-dicarboxyphenyl)hexafluoro dianhydride (hereinafter abbreviated to "6FDA"), and reaction was then carried out at 20 to 30° C. for 4 hours to obtain a polyamic acid in which γ-aminopropyl)-tri-ethoxysilane was added to terminals of the acid.

To this solution was added 16.28 g (0.0789 mol) of DCC, followed by reaction at 20 to 30° C. for 4 hours to perform isoimidation. Next, 3.56 g (0.0592 mol) of n-propanol was added thereto, followed by stirring at 40 to 50° C. for 16 hours to perform esterification. Afterward, a secondarily produced urea compound was removed from this solution by filtration, and the filtrate was then slowly poured into methanol, so that a white precipitate was obtained. This precipitate was collected by filtration, and then dried at 50° C. for 15 hours in a vacuum dryer to obtain a partially esterified silicon-containing polyamic acid ester (c) in which (γ-aminopropyl)-tri-ethoxysilane was added to terminals.

Synthetic Example 17
[Synthesis of a Partially Esterified Silicon-containing Polyamic Acid Ester (c)]

The same device as in Synthetic Example 9 was assembled. Next, 250 g of dehydrated and purified NMP, 18.31 g (0.0737 mol) of bis(3-aminopropyl) tetramethyldisiloxane (hereinafter abbreviated to "APDS") and 8.76 g (0.0295 mol) of 4-aminophenyl-tri-n-propoxysilane were poured into the device, and they were then continuously stirred to dissolve them. To the resulting solution was added 26.01 g (0.0884 mol) of 3,3',4,4'-biphenyltetracarboxylic dianhydride (hereinafter abbreviated to "BPDA"), and reaction was then carried out at 20 to 30° C. for 4 hours to obtain a polyamic acid in which 4-aminophenyl-tri-n-propoxysilane was added to terminals of the acid.

To this solution was added 18.24 g (0.0884 mol) of DCC, followed by stirring at 20 to 30° C. for 4 hours to perform isoimidation. Next, 19.12 g (0.1768 mol) of n-hexyl alcohol was added thereto, and the solution was then stirred at 40 to 50° C. for 16 hours to carry out esterification. After a secondarily produced urea compound was removed from this solution by filtration, the filtrate was then slowly poured into methanol, so that a white precipitate was obtained. This precipitate was collected by filtration, and then dried at 50° C. for 15 hours in a vacuum dryer to obtain a partially esterified silicon-containing polyamic acid ester (c) in which 4-aminophenyl-tri-n-propoxysilane was added to terminals of the ester.

Synthetic Example 18
[Synthesis of a Partially Esterified Silicon-containing Polyamic Acid Ester (c)]

The same device as in Synthetic Example 9 was assembled. Next, 250 g of dehydrated and purified NMP, 12.60 g (0.0629 mol) of DDE and 6.02 g (0.0315 mol) of (γ-aminopropyl)-methyl-di-ethoxysilane were poured into the device, and they were then continuously stirred to dissolve them. To the resulting solution was added 23.35 g (0.0787 mol) of BTDA, and reaction was then carried out at 20 to 30° C. for 4 hours to obtain a polyamic acid in which (γ-aminopropyl)-methyl-di-ethoxysilane was added to terminals of the acid.

To this solution was added 38.90 g (0.1573 mol) of EEDQ, followed by stirring at 30 to 40° C. for 2 hours to perform isoimidation. Next, 7.24 g (0.1718 mol) of ethanol was added thereto, and the solution was then stirred at 40 to 50° C. for 8 hours to carry out esterification. Afterward, this solution was slowly poured into isopropanol, so that a white precipitate was obtained. This precipitate was collected by filtration, and then dried at 50° C. for 15 hours in a vacuum dryer to obtain a partially esterified silicon-containing polyamic acid ester (c) in which (γ-aminopropyl)-methyl-di-ethoxysilane was added to terminals of the ester.

Synthetic Example 19
[Synthesis of a Partially Esterified Silicon-containing Polyamic Acid Ester (c)]

The same device as in Synthetic Example 9 was assembled. Next, 250 g of dehydrated and purified NMP, 14.30 g (0.0714 mol) of DDE and 4.19 g (0.0196 mol) of 4-aminophenyl-tri-methoxysilane were poured, and they were then continuously stirred to dissolve them. To the resulting solution was added 19.47 g (0.0893 mol) of BTDA, and reaction was then carried out at 20 to 30° C. for 4 hours to obtain a polyamic acid in which 4-aminophenyl-tri-methoxysilane was added to terminals of the acid.

To this solution was added 33.11 g (0.1339 mol) of EEDQ, followed by stirring at 30 to 40° C. for 2 hours to partially perform isoimidation. Next, 6.16 g (0.1339 mol) of ethanol was added thereto, and the solution was then stirred at 40 to 50° C. for 8 hours to carry out esterification. Afterward, this solution was slowly poured into isopropanol, so that a white precipitate was obtained. This precipitate was collected by filtration, and then dried at 50° C. for 15 hours in a vacuum dryer to obtain a partially esterified silicon-containing polyamic acid ester (c) in which 4-aminophenyl-tri-methoxysilane was added to terminal of the ester.

Tables 2 and 3 show mols of tetracarboxylic dianhydrides, derivatives in which alcohols were added to the tetracarboxylic dianhydrides, diamines and aminosilicon compounds; solvents; values of C/(A−B) and C/(B+C); concentrations of silicon-containing polyamic acids in solutions; values of $100(2f+n+m)/2(e+f+m+n+h+i)$ designating content ratios of ester side chains; and values of $100(m+h+2i)/2(e+f+m+n+h+i)$ designating imidation ratios in the formula (12). Incidentally, this imidation ratio is measured by an infrared absorption spectrum method, and the content ratio of the ester side chain is a value calculated by subtracting a ratio of an imidated portion shown by the imidation ratio from a ratio of an isoimidated portion.

Abbreviations used in Tables 1, 2 and 3 are as follows:

(Tetracarboxylic Dianhydrides)

BTDA: 3,4,3',4'-benzophenonetetracarboxylic dianhydride

PMDA: pyromellitic anhydride

BPDA: 3,3',4,4'-biphenyltetracarboxylic dianhydride

DSDA: bis(3,4-dicarboxyphenyl)sulfone dianhydride

ODPA: bis(3,4-dicarboxyphenyl) ether dianhydride

6FDA: 2,2-bis(3,4-dicarboxyphenyl)hexafluoro dianhydride (Derivatives in Which Alcohols are Added to Tetracarboxylic Dianhydrides)

PMDA-E: A derivative obtained in Synthetic Example 8

BTDA-P: A derivative obtained in Synthetic Example 9

(Diamines)

DDE: 4,4'-diaminodiphenylether

BAPP: 2,2-bis{4-(4-aminophenoxy)phenyl)propane

BAPS: 4,4'-di(paraaminophenoxy)diphenylsulfone

DDS: 3,3'-diaminodiphenylsulfone

PDA: paraphenylenediamine

APDS: bis(3-aminopropyl)tetramethyldisiloxane (Aminosilicon Compounds)

APMS: 4-aminophenyl-tri-methoxysilane

APPS: 4-aminophenyl-tri-n-propoxysilane

APES: 4-aminophenyl-tri-ethoxysilane

APS-E: (γ-aminopropyl)-tri-ethoxysilane

APME: (γ-aminopropyl)-methyl-di-ethoxysilane (Solvents)

NMP: N-methyl-2-pyrrolidone

DMAC: N,N-dimethylacetamide

TABLE 1

| Synthetic Example No. | Reaction Components | | | |
|---|---|---|---|---|
| | Tetracarboxylic Dianhydride g (A mol) | Diamine g (B mol) | Aminosilicon Compound g (C mol) | Solvent NMP g |
| 1 | BTDA 63.13 (0.1959) | DDE 32.69 (0.1633) | APMS 13.93 (0.0653) | 500 |
| 2 | PMDA 59.60 (0.2732) | DDE 41.03 (0.2049) | APPS 24.37 (0.0820) | 500 |
| 3 | BPDA 31.02 (0.1054) | BAPP 40.39 (0.0983) | APMS 3.30 (0.0155) | 500 |
| 4 | DSDA 40.22 (0.1123) | BAPS 38.84 (0.0893) | APES 9.17 (0.0359) | 500 |
| 5 | ODPA 46.63 (0.1503) | DDS 32.66 (0.1315) | APPS 8.94 (0.0301) | 500 |
| 6 | 6FDA 58.17 (0.1310) | PDA 13.28 (0.1228) | APS-E 3.26 (0.0147) | 500 |
| 7 | BTDA 90.26 (0.2801) | APDA 60.91 (0.2461) | APS-E 15.49 (0.0700) | 500 |

TABLE 1-continued

| Synthetic Example No. | Reaction Components | | | | |
|---|---|---|---|---|---|
| | Relation of A, B and C | | Silicon-Containing Polyamic Acid | Ester Content | Imidation |
| | Formula (2) C/(A − B) | Formula (3) C/(B + C) | Conc. in Solution (wt %) | (%) | Ratio (%) |
| 1 | 2.0 | 0.286 | 18.0 | 0 | 0 |
| 2 | 1.2 | 0.286 | 20.0 | 0 | 0 |
| 3 | 2.2 | 0.136 | 13.0 | 0 | 0 |
| 4 | 1.6 | 0.286 | 15.0 | 0 | 0 |
| 5 | 1.6 | 0.186 | 15.0 | 0 | 0 |
| 6 | 1.8 | 0.107 | 13.0 | 0 | 0 |
| 7 | 2.0 | 0.222 | 25.0 | 0 | 0 |

TABLE 2

| Synthetic Example No. | Reaction Components | | | |
|---|---|---|---|---|
| | Tetracarboxylic Dianhydride or Derivative g (A mol) | Diamine g (B mol) | Aminosilicon Compound g (C mol) | Solvent g |
| 10 | PMDA-E 36.89 (0.1190) | DDE 22.23 (0.1110) | APMS 3.38 (0.0158) | NMP 250 |
| 11 | PMDA-E, PMDA 13.43, 9.44 (0.0433, 0.0433) | BAPP 33.18 (0.0808) | APMS 2.46 (0.0115) | DMAc 250 |
| 12 | BTDA-P 42.04 (0.0950) | DDE 17.76 (0.0887) | APPS 2.70 (0.0127) | NMP 250 |
| 13 | BTDA 27.68 (0.0859) | DDE 8.60 (0.0430) | APMS 18.32 (0.0859) | NMP 250 |
| 14 | BTDA 23.95 (0.0743) | BAPS 24.11 (0.0557) | APES 7.59 (0.0297) | DMAc 250 |

| Synthetic Example No. | Relation of A, B and C | | Kind of Used Alcohol | Ester Content (%) | Imidation Ratio (%) |
|---|---|---|---|---|---|
| | Formula (2) C/(A − B) | Formula (3) C/(B + C) | | | |
| 10 | 2.0 | 0.125 | Ethanol | 100 | 0 |
| 11 | 2.0 | 0.125 | Ethanol | 95 | 5 |
| 12 | 2.0 | 0.125 | n-propanol | 100 | 0 |
| 13 | 2.0 | 0.666 | Ethanol | 92 | 8 |
| 14 | 1.6 | 0.348 | Ethanol | 89 | 11 |

TABLE 3

| Synthetic Example No. | Reaction Components | | | |
|---|---|---|---|---|
| | Tetracarboxylic Dianhydride or Derivative g (A mol) | Diamine g (B mol) | Aminosilicon Compound g (C mol) | Solvent g |
| 15 | PMDA 15.72 (0.0721) | DDE 12.03 (0.0600) | APPS 5.00 (0.0168) | NMP 250 |
| 16 | 6FDA 17.52 (0.0394) | BAPP 15.12 (0.0368) | APS-E 1.16 (0.0052) | NMP 250 |
| 17 | BPDA 26.01 (0.0884) | APDS 18.31 (0.0737) | APPS 8.76 (0.0295) | NMP 250 |

TABLE 3-continued

| | Reaction Components | | | |
|---|---|---|---|---|
| 18 | BTDA<br>23.35<br>(0.0787) | DDE<br>12.60<br>(0.0629) | APME<br>6.02<br>(0.0315) | NMP<br>250 |
| 19 | PMDA<br>19.17<br>(0.0893) | DDE<br>14.30<br>(0.0714) | APMS<br>4.19<br>(0.0196) | NMP<br>250 |

| Synthetic<br>Example<br>No. | Relation of A, B and C | | Kind of<br>Used<br>Alcohol | Ester<br>Content<br>(%) | Imidation<br>Ratio<br>(%) |
|---|---|---|---|---|---|
| | Formula (2)<br>C/(A − B) | Formula (3)<br>C/(B + C) | | | |
| 15 | 1.4 | 0.219 | Methanol | 90 | 10 |
| 16 | 2.0 | 0.124 | n-propanol | 67 | 33 |
| 17 | 2.0 | 0.286 | n-hexyl<br>alcohol | 45 | 5 |
| 18 | 2.0 | 0.334 | Ethanol | 87 | 13 |
| 19 | 1.1 | 0.215 | Ethanol | 69 | 6 |

Example 1

First, 0.126 g of a compound for generating an acid by light irradiation (hereinafter abbreviated to "light acid generator") was added to 10 g of a solution of a silicon-containing polyimide precursor (a) (a polyamic acid) synthesized in Synthetic Example 1 [in a ratio of 7 parts by weight of the light acid generator to 100 parts by weight of the silicon-containing polyimide precursor (a)] to prepare a photosensitive resin composition.

A silicon wafer was coated with this photosensitive resin composition by rotation, and then dried at 70° C. for 3 minutes on a hot plate. At this time, the rotation at the coating was adjusted so that the thickness of the dry film might be about 3 μm. Next, the coating film was exposed to light from an ultra-high pressure mercury arc lamp (9 mW/cm$^2$) through a negative mask on which a pattern for forming holes of 10×10 μm was drawn. After the exposure, the film was heated for 2 minutes on the hot plate at 70° C., developed with a mixed solution of 70 parts by weight of NMP and 30 parts by weight of isopropyl alcohol, rinsed with water, and then dried. In consequence, the pattern having all the sharp holes of 10×10 μm was obtained on the film. This film having the pattern was baked at 150° C. for 30 minutes and further at 400° C. for 60 minutes, but any breakage of the pattern was not observed.

The exposures of the irradiated light and the test results of the patterning (the polyimide film) are shown in Tables 4, 5 and 6.

Examples 2 to 7

The same procedure as in Example 1 was carried out except that polyamic acid solutions and light acid generators were changed as shown in Table 4, to prepare photosensitive resin compositions. Furthermore, patterning and baking were carried out in the same manner as in Example 1, changing exposure conditions alone. In all the cases, any breakage of the patterns was not observed.

Example 8

First, 4.29 g of a silicon-containing polyimide precursor (a) (a polyamic acid ester) synthesized in Synthetic Example 10 was dissolved in 10 g of DMAc to form a solution at a concentration of 30% by weight. Next, 0.558 g of a compound for generating an acid by light irradiation was added to this solution [in a ratio of 5 parts by weight of the light acid generator to 100 parts by weight of the silicon-containing polyimide precursor (a)] to prepare a photosensitive resin composition. A silicon wafer was coated with this photosensitive resin composition by rotation, and then dried at 90° C. for 3 minutes (this treatment and the temperature at this time would be abbreviated to "PB" and "PB temperature", respectively). At this time, the rotation at the coating was adjusted so that the thickness of the dry film might be about 3 μm. Next, the coating film was exposed to light from an ultra-high pressure mercury arc lamp (9 mW/cm$^2$) through a negative mask on which a pattern for forming holes of 10×10 μm was drawn. After the exposure, the film was heated for 2 minutes on the hot plate at 160° C. (this treatment and the temperature at this time would be abbreviated to "PEB" and "PEB temperature", respectively), developed with a mixed solution of 70 parts by weight of NMP and 30 parts by weight of isopropyl alcohol, rinsed with water, and then dried. In consequence, the pattern having the sharp holes of 10×10 μm was obtained on the film. This film having the pattern was baked at 150° C. for 30 minutes and further at 400° C. for 60 minutes, but any breakage of the pattern was not observed.

Examples 9 to 17

The same procedure as in Example 8 was carried out except that solvents, polyamic acid esters, concentrations, light acid generators, parts by weight of the light acid generators, PB temperatures, exposures and PEB temperatures were changed as in Tables 5 and 6, to prepare photosensitive resin compositions, followed by patterning and baking. In all the products, any breakage of the patterns was not observed.

Abbreviations used in Tables 4, 5 and 6 are as follows:

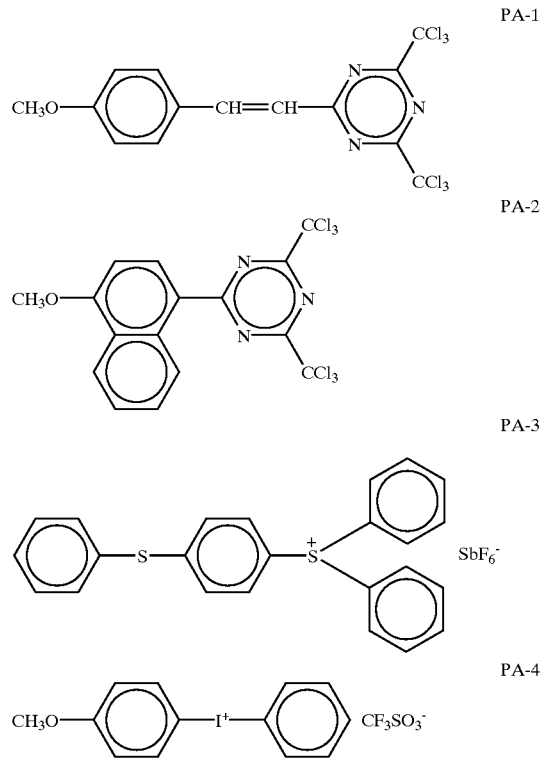

-continued

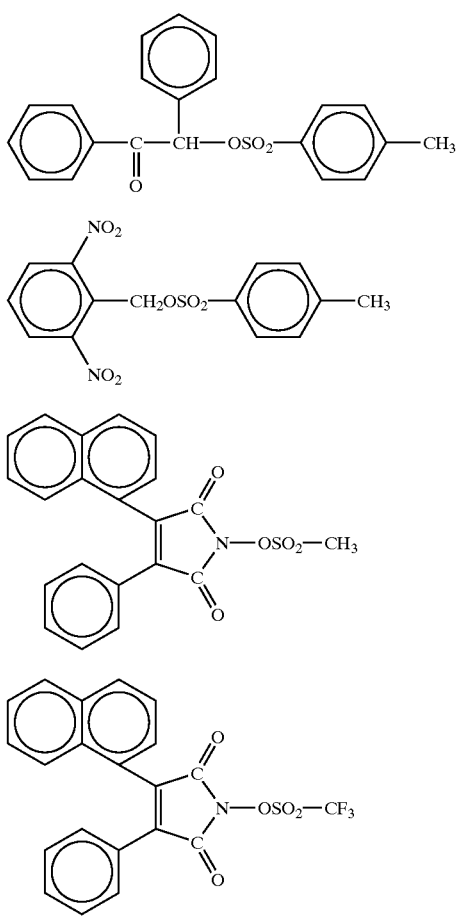

Moreover, in order to confirm the magnitude of the change of film thickness which was attributed to volume shrinkage at the time of curing by heating, the thickness of a film after a final baking was subtracted from that of a film after the development of an exposed portion in each example, and an obtained value was then divided by the thickness of the film after the development and expression was given with percentage. The results are shown in Tables 4, 5 and 6.

Afterward, a cured film was formed on a silicon wafer in the same manner as in the above-mentioned examples except that any mask was not used in order to confirm adhesion to the substrate, and the cured film was then cut into 100 small square pieces having a size of 2×2 mm. Next, a cellophane tape was stuck on the surface of each piece and then immediately peeled therefrom. The number of the pieces from which the films were peeled was counted to evaluate the adhesion. The results are shown in Tables 4, 5 and 6.

Comparative Example 11

A polyamic acid was synthesized by the utilization of the same devices and procedure as in Synthetic Example 1 and by the use of 500 g of NMP, 42.05 g (0.1305 mol) of BTDA and 26.13 g (0.1305 mol) of DDE. Next, a silicon wafer was coated with the solution of this polyamic acid in the same manner as in each example, and patterning was similarly tried. As a developing solution, a mixed solution of 70 parts by weight of NMP and 30 parts by weight of isopropyl alcohol was used. As a result, any pattern was not obtained even by the irradiation of light of 5000 mJ/cm².

TABLE 4

Photosensitive Resin Composition

| Example | Polyamic Acid Solution (g) | Light Acid Generator (g) | PB PB Temp. (° C.) |
|---|---|---|---|
| 1 | Synthetic Example 1 (10.0) | PA-1 (0.126) | 70 |
| 2 | Synthetic Example 2 (10.0) | PA-1 (0.140) | 70 |
| 3 | Synthetic Example 3 (10.0) | PA-2 (0.091) | 70 |
| 4 | Synthetic Example 4 (10.0) | PA-3 (0.105) | 70 |
| 5 | Synthetic Example 5 (10.0) | PA-4 (0.105) | 70 |
| 6 | Synthetic Example 6 | PA-5 (0.091) | 70 |
| 7 | Synthetic Example 7 | PA-6 (0.175) | 70 |
| Comp. Ex. 2 | Comparative Example 1 | | |

| Example | Exposure Conditions Exposure (mJ/cm²) | PEB PEB Temperature (° C.) | Patterned Polyimide Film Change of Film Thickness (%) | Adhesive Properties (Number of Peeled Films) |
|---|---|---|---|---|
| 1 | 200 | 70 | 20 | 0 |
| 2 | 150 | 70 | 27 | 0 |
| 3 | 400 | 70 | 16 | 0 |
| 4 | 150 | 70 | 18 | 0 |
| 5 | 300 | 70 | 21 | 0 |
| 6 | 350 | 70 | 18 | 0 |
| 7 | 400 | 70 | 20 | 0 |
| Comp. Ex. 2 | 1500 | | 45 | 100 |

TABLE 5

Photosensitive Resin Composition

| Example | Solvent weight (g) | Polyamic Acid Ester (g) Conc. (wt %) | Light Acid Generator (g) wt. pts. | PB PB Temp. (° C.) |
|---|---|---|---|---|
| 8 | NMP (10.0) | Synthetic Example 10 (4.285) (30.0) | PA-1 (0.214) 5.0 | 90 |
| 9 | DMAc (10.0) | Synthetic Example 11 (4.2851) (30.0) | PA-4 (0.338) 7.0 | 90 |
| 10 | DMAc (10.0) | Synthetic Example 12 (4.285) (30.0) | PA-5 (0.627) 13.0 | 90 |
| 11 | NMP (10.0) | Synthetic Example 13 (4.706) (32.0) | PA-7 (0.038) 0.8 | 90 |
| 12 | γ-butyrolactone (10.0) | Synthetic Example 14 (3.333) (25.0) | PA-7 (0.067) 2.0 | 90 |

| Example | Exposure Conditions Exposure (mJ/cm²) | PEB PEB Temperature (° C.) | Patterned Polyimide Film Change of Film Thickness (%) | Adhesive Properties (Number of Peeled Films) |
|---|---|---|---|---|
| 8 | 180 | 140 | 24 | 0 |
| 9 | 200 | 150 | 20 | 0 |
| 10 | 200 | 140 | 29 | 0 |
| 11 | 150 | 160 | 21 | 0 |
| 12 | 70 | 170 | 17 | 0 |

TABLE 6

Photosensitive Resin Composition

| Example | Solvent weight (g) | Polyamic Acid Ester (g) Conc. (wt %) | Light Acid Generator (g) wt. pts. | PB PB Temp. (° C.) |
|---|---|---|---|---|
| 13 | NMP (10.0) | Synthetic Example 15 (2.048) (17.0) | PA-8 (0.143) 7.0 | 90 |
| 14 | NMP (10.0) | Synthetic Example 16 (1.494) (13.0) | PA-2 (0.179) 10.0 | 90 |
| 15 | NMP (10.0) | Synthetic Example 17 (2.048) (17.0) | PA-1 (0.143) 7.0 | 70 |
| 16 | DMAc (10.0) | Synthetic Example 18 (2.195) (18.0) | PA-3 (0.088) 4.0 | 90 |
| 17 | NMP (10.0) | Synthetic Example 19 (2.195) (18.0) | PA-7 (0.220) 10.0 | 80 |

| | Exposure | PEB | Patterned Polyimide Film | |
|---|---|---|---|---|
| Example | Exposure Conditions (mJ/cm²) | PEB Temperature (° C.) | Change of Film Thickness (%) | Adhesive Properties (Number of Peeled Films) |
| 13 | 70 | 160 | 24 | 0 |
| 14 | 90 | 170 | 22 | 0 |
| 15 | 200 | 80 | 28 | 0 |
| 16 | 180 | 170 | 25 | 0 |
| 17 | 220 | 90 | 24 | 0 |

Comparative Example 2

0.96 g of dimethylaminoethyl methacrylate and 0.05 g of Michler's ketone were added to 10 g of a solution synthesized in Comparative Example 1, and they were then dissolved. By the use of this solution, the change of film thickness and adhesion were evaluated by the same procedure as in each example. As a developing solution, a mixed solution of 70 parts by weight of NMP and 30 parts by weight of isopropyl alcohol was used. Exposures of irradiated light and the respective evaluation results are set forth in Table 4. From comparison with the examples, it is apparent that in the photosensitive resin compositions of the present invention, the change of the film thickness is small and the adhesion to the substrate is excellent.

What we claimed is:

1. A negative photosensitive resin composition which comprises (a) an acid generating compound for generating an acid by light irradiation and (b) a silicon-containing polyimide ester precursor comprising a partially esterified silicon-containing polyamic acid ester obtained from (i) A mols of a derivative of a tetracarboxylic dianhydride, said derivative formed by reacting 1 to 2 mols of a monovalent saturated alcohol with 1 mol of the tetracarboxylic dianhydride, (ii) B mols of a diamine and (iii) C mols of an aminosilicon compound represented by the formula (1)

$$H_2N-R^1-SiR^2_{3-k}X_k \qquad (1)$$

wherein $R^1$ is $-(CH_2)_s-$,

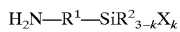

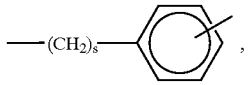

-continued

s is an integer of from 1 to 4; $R^2$ is independently an alkyl group having 1 to 6 carbon atoms, a phenyl group or a phenyl group substituted by an alkyl group having 7 to 12 carbon atoms; X is a hydrolytic alkoxy group; and k is $1 \leq k \leq 3$ in a ratio meeting the following formulae (2) and (3)

$$1 \leq \frac{C}{A-B} \leq 2.5 \qquad (2)$$

$$0.1 \leq \frac{C}{B+C} \leq 1, \qquad (3)$$

wherein, upon exposure of said composition to light, the acid generating compound generates acid, which causes a silane at the end of the silicon-containing partially esterified polyimide ester precursor to undergo a siloxane condensation reaction and a subsequent intermolecular cross-linking reaction with another silane.

2. The photosensitive resin composition according to claim 1 wherein X of the aminosilicon compound represented by the formula (1) is an alkoxyl group having 1 to 4 carbon atoms, and $R^1$ is a phenylene group or a trimethylene group.

3. The photosensitive resin composition according to claim 1 wherein the amount of the compound for generating an acid by light irradiation is in the range of from 0.5 to 15 parts by weight based on 100 parts by weight of the polyimide ester precursor.

4. The photosensitive resin composition according to claim 1 wherein said compound for generating an acid by light irradiation is a halomethyl triazine compound.

5. The photosensitive resin composition according to claim 1 wherein said compound for generating an acid by light irradiation is benzoin tosylate.

6. The photosensitive resin composition according to claim 1 wherein said compound for generating an acid by light irradiation is 2-(6-methoxynaphthyl-2-yl)-4,6-bis-trichloromethyl-s-triazine.

7. The photosensitive resin composition according to claim 1 wherein said compound for generating an acid by light irradiation is 2-(4-methoxystyryl)-4,6-bis-trichloromethyl-s-triazine.

8. The photosensitive resin composition according to claim 1 wherein said compound for generating an acid by light irradiation is diphenyl(4-thiophenoxyphenyl)-sulfonium hexafluoroantimonate.

9. The photosensitive resin composition according to claim 1 wherein said compound for generating an acid by light irradiation is (4-methoxyphenyl)phenyliodonium trifluoromethane sulfonate.

10. The photosensitive resin composition according to claim 1 wherein said compound for generating an acid by light irradiation is N-{(methanesulfonyl)oxy}-2-(α-naphthyl)-3-phenylmaleimide.

11. The photosensitive resin composition according to claim 1 wherein said compound for generating an acid by light irradiation is N-{trifluoromethanesulfonyl)oxy}-2-(α-naphthyl)-3-phenylmaleimide.

12. The photosensitive resin composition according to claim 1 wherein the monovalent saturated alcohol is a monovalent saturated alcohol having 1 to 7 carbon atoms.

13. The method of claim 1, wherein said acid generating compound is selected from the group consisting of:

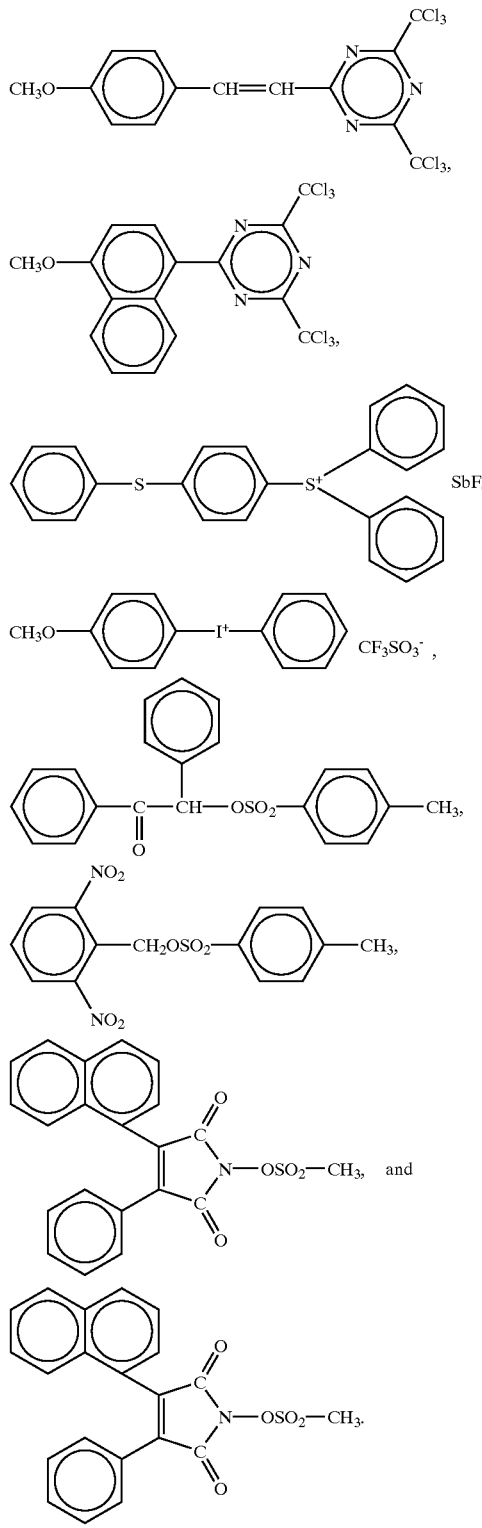

and

14. A negative photosensitive resin composition which comprises an acid generating compound for generating an acid by light irradiation and at least one polyimide precursor selected from the group consisting of (a) a silicon-containing polyimide precursor obtained from (1) A mols of a derivative of a tetracarboxylic dianhydride formed by reacting 1 or 2 mols of a monovalent saturated alcohol having 1 to 7 carbon atoms with 1 mol of the tetracarboxylic dianhydride, (2) B mols of a diamine and (3) C mols of an aminosilicon compound represented by the formula (1)

wherein $R^1$ is $-(CH_2)_s-$,

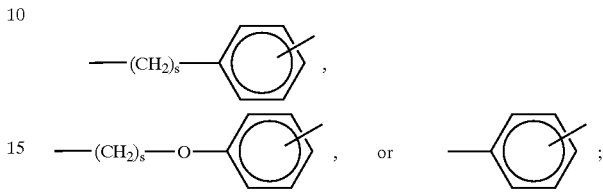

$s$ is an integer of from 1 to 4; $R^2$ is independently an alkyl group having 1 to 6 carbon atoms, a phenyl group or a phenyl group substituted by an alkyl group having 7 to 12 carbon atoms; X is a hydrolytic alkoxy group; and k is $1 \leq k \leq 3$ in a ratio meeting the following formulae (2) and (3)

(b) a silicon-containing polyamic acid ester obtained by esterifying the precursor (a) with a monovalent saturated alcohol having 1 to 7 carbon atoms, and (c) a partially esterified silicon-containing polyamic acid ester obtained by partially esterifying the precursor (a) with the movement saturated alcohol having 1 to 7 carbon atoms, wherein the tetracarboxylic dianhydride is represented by the formula (4)

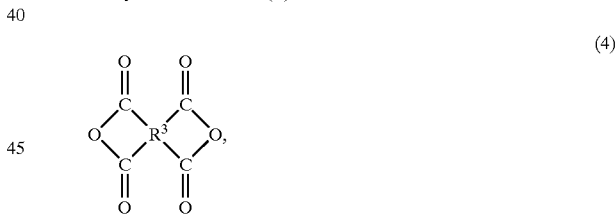

the diamine is represented by the formula (5)

the main chain of the polyimide precursor comprises e mols, f mols, n mols, m mols, h mols, i mols (where each of e, f, n, m, h and i is 0 or a positive integer) of structural units represented by the formula (6), (7), (8), (9), (10) and (11), respectively,

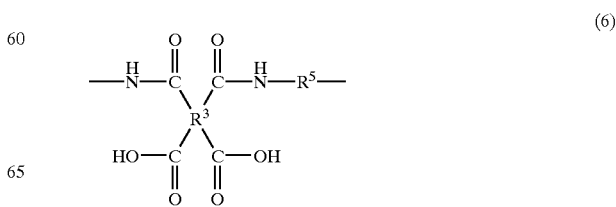

-continued

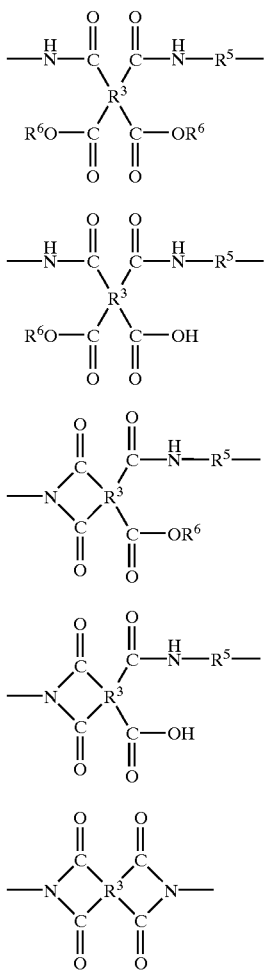

and e, f, n, m, h and i meet the equation (12)

$$0 \leq 100 \times \frac{m+h+2i}{2(e+f+n+m+h+i)} < 40 \quad (12)$$

wherein each $R^3$ is independently a tetravalent carbocyclic aromatic group, a heterocyclic group, an alicyclic group or an aliphatic group;

each $R^5$ is independently a divalent aliphatic group having 2 or more carbon atoms, an alicyclic group, an aromatic aliphatic group, a carbocyclic aromatic group, a heterocyclic group or a polysiloxane group;

$R^6$ is an alkyl group having 1 to 7 carbon atoms; and wherein, upon exposure of said composition to light, the acid generating compound generates acid, which causes a silane at the end of at least one polyimide precursor to undergo a siloxane condensation reaction and a subsequent intermolecular cross-linking reaction with another silane.

15. The photosensitive resin composition according to claim 14 wherein the partially esterified silicon-containing polyamic acid ester (c) is the partially esterified silicon-containing polyamic acid ester (c) which is partially imidated to less than 40%.

16. The method of claim 14, wherein said acid generating compound is selected from the group consisting of:

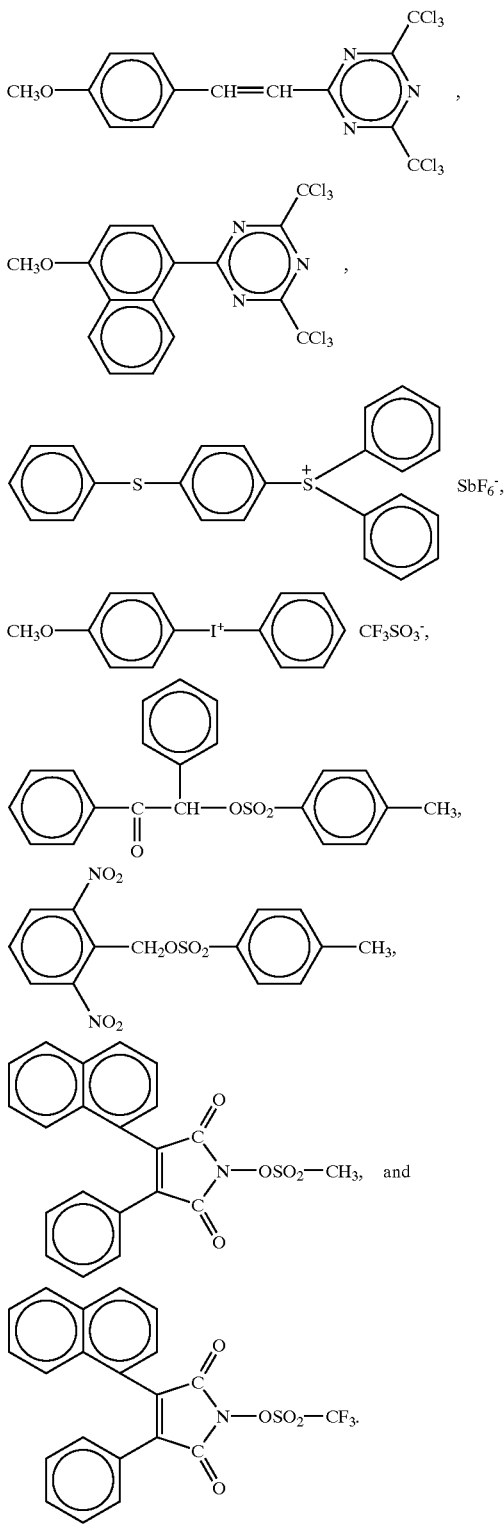

17. A negative photosensitive resin composition which comprises an acid generating compound for generating an acid by light irradiation and a silicon-containing polyamic acid ester formed by esterifying a silicon-containing polyimide precursor obtained by reacting A mols of a tetracarboxylic dianhydride, B mols of a diamine and C mols of an aminosilicon compound represented by the formula (1)

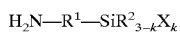  (1)

wherein $R^1$ is —$(CH_2)_s$—,

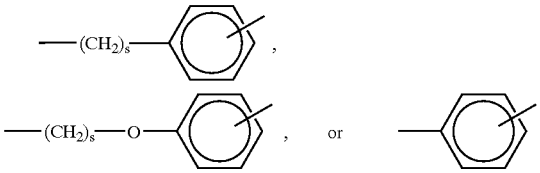

s is an integer of from 1 to 4; $R^2$ is independently an alkyl group having 1 to 6 carbon atoms, a phenyl group or a phenyl group substituted by an alkyl group having 7 to 12 carbon atoms; X is a hydrolytic alkoxy group; and k is $1 \leq k \leq 3$ in a ratio meeting the following formulae (2) and (3)

$$1 \leq \frac{C}{A-B} \leq 2.5 \quad (2)$$

$$0.1 \leq \frac{C}{B+C} \leq 1 \quad (3)$$

with a monovalent saturated alcohol having 1 to 7 carbon atoms, wherein, upon exposure of said composition to light, the acid generating compound generates acid, which causes a silane at the end of the silicon-containing polyamic acid ester to undergo a siloxane condensation reaction and a subsequent intermolecular cross-linking reaction with another silane.

18. The method of claim 17, wherein said acid generating compound is selected from the group consisting of:

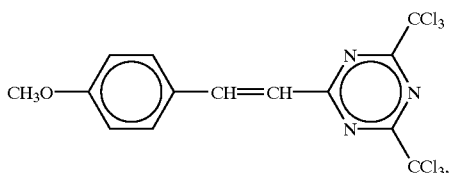

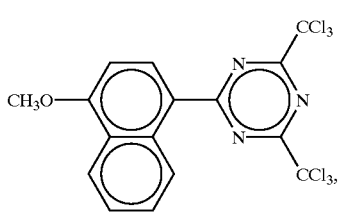

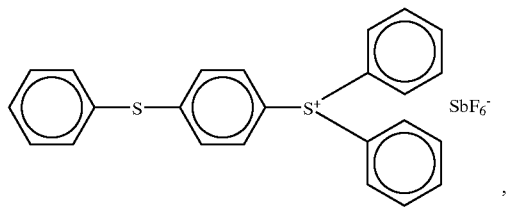

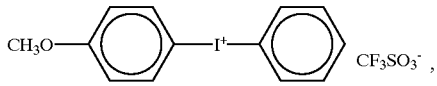

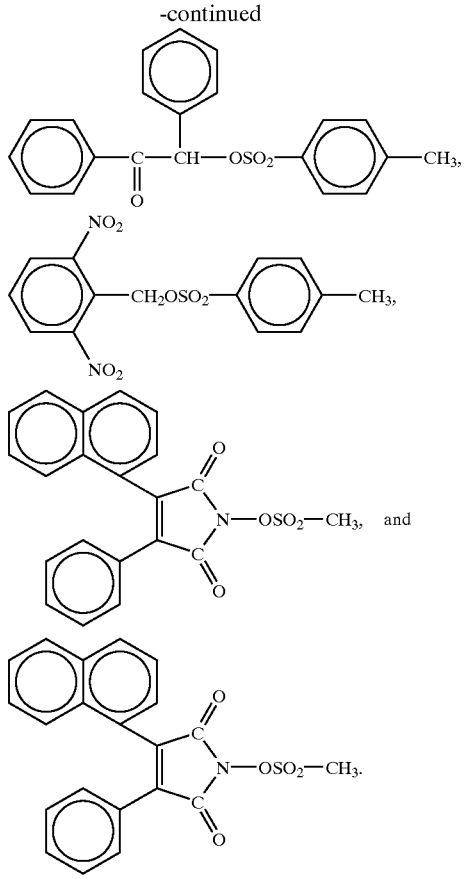

19. A negative photosensitive resin composition which comprises an acid generating compound for generating an acid by light irradiation and a partially esterified silicon-containing polyamic acid ester formed by partially esterifying a silicon-containing polyimide precursor obtained by reacting A mols of a tetracarboxylic dianhydride, B mols of a diamine and C mols of an aminosilicon compound represented by the formula (1)

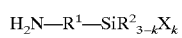  (1)

wherein $R^1$ is —$(CH_2)_s$—,

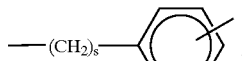

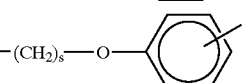

s is an integer of from 1 to 4; $R^2$ is independently an alkyl group having 1 to 6 carbon atoms, a phenyl group or a phenyl group substituted by an alkyl group having 7 to 12 carbon atoms; X is a hydrolytic alkoxy group; and k is $1 \leq k \leq 3$ in a ratio meeting the following formulae (2) and (3)

$$1 \leq \frac{C}{A-B} \leq 2.5 \quad (2)$$

$$0.1 \leq \frac{C}{B+C} \leq 1, \tag{3}$$

with a monovalent saturated alcohol having 1 to 7 carbon atoms, wherein, upon exposure of said composition to light, the acid generating compound generates acid, which causes a silane at the end of the silicon-containing partially esterified polyamic acid ester to undergo a siloxane condensation reaction and a subsequent intermolecular cross-linking reaction with another silane.

20. The method of claim 19, wherein said acid generating compound is selected from the group consisting of:

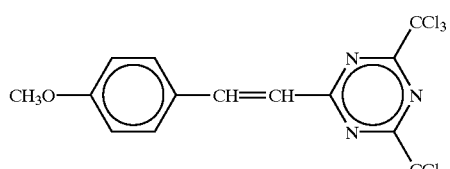

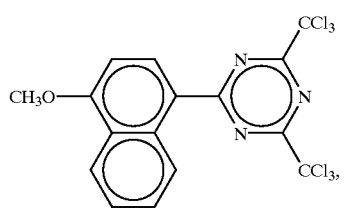

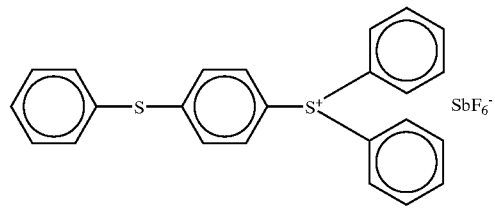

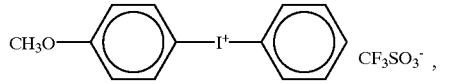

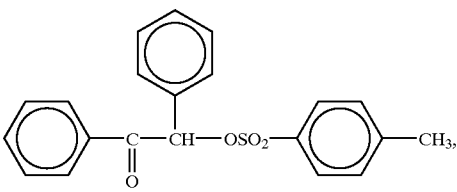

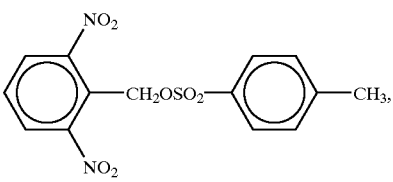

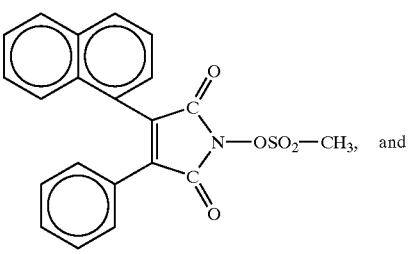, and

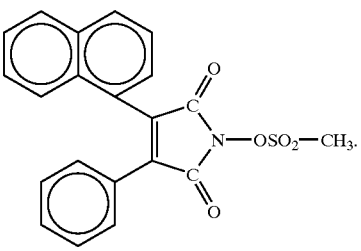.

* * * * *

UNITED STATES PATENT AND TRADEMARK OFFICE
CERTIFICATE OF CORRECTION

PATENT NO. : 6,664,021 B1
DATED : December 16, 2003
INVENTOR(S) : Maeda et al.

It is certified that error appears in the above-identified patent and that said Letters Patent is hereby corrected as shown below:

Column 27,
Lines 50-60, replace the formula with the following formula:

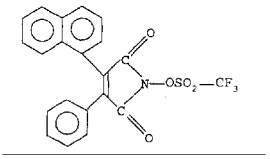

Column 32,
Lines 25-35, replace the formula with the following formula:

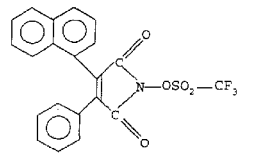

Column 34,
Lines 30-40, replace the formula with the following formula:

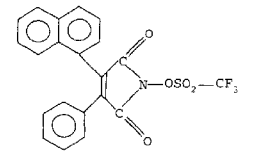

Signed and Sealed this

Seventh Day of September, 2004

JON W. DUDAS
*Director of the United States Patent and Trademark Office*